(12) United States Patent
Gatard et al.

(10) Patent No.: US 10,164,575 B2
(45) Date of Patent: Dec. 25, 2018

(54) SYSTEM FOR MONITORING THE PEAK POWER FOR AN RF POWER AMPLIFICATION AND ASSOCIATED METHOD OF CALCULATING PEAK VALUE AND OF SELECTING SUPPLY VOLTAGE

(71) Applicant: WUPATEC, Limoges (FR)

(72) Inventors: Emmanuel Gatard, Panazol (FR); Pierre Lachaud, Saint Just le Martel (FR)

(73) Assignee: WUPATEC, Limoges (FR)

( * ) Notice: Subject to any disclaimer, the term of this patent is extended or adjusted under 35 U.S.C. 154(b) by 0 days.

(21) Appl. No.: 15/543,887

(22) PCT Filed: Jan. 11, 2016

(86) PCT No.: PCT/FR2016/050043
§ 371 (c)(1),
(2) Date: Jul. 14, 2017

(87) PCT Pub. No.: WO2016/113493
PCT Pub. Date: Jul. 20, 2016

(65) Prior Publication Data
US 2017/0373644 A1    Dec. 28, 2017

(30) Foreign Application Priority Data
Jan. 15, 2015 (FR) .................................. 15 50331

(51) Int. Cl.
*H03G 3/20* (2006.01)
*H03F 1/02* (2006.01)
(Continued)

(52) U.S. Cl.
CPC .......... *H03F 1/0227* (2013.01); *H02M 3/156* (2013.01); *H03F 1/025* (2013.01);
(Continued)

(58) Field of Classification Search
CPC ....... H03F 1/0211; H03F 1/0244; H03F 1/025
(Continued)

(56) References Cited

U.S. PATENT DOCUMENTS

2006/0028271 A1    2/2006 Wilson
2008/0310200 A1    12/2008 Maksimovic et al.
(Continued)

FOREIGN PATENT DOCUMENTS

EP    2 302 788 A1    3/2011
KR    101249016 B1    4/2013
(Continued)

OTHER PUBLICATIONS

Kimball et al., "High-Efficiency Envelope-Tracking W-CDMA Base-Station Amplifier Using GaN HFETs", IEEE Transactions on Microwave Theory and Techniques, Nov. 2006, p. 3848-3856, vol. 54, No. 11.
(Continued)

*Primary Examiner* — Steven J Mottola
(74) *Attorney, Agent, or Firm* — Young & Thompson

(57) ABSTRACT

Disclosed is a system for monitoring the peak power of a telecommunication signal to be transmitted for RF power amplification of the telecommunication signal to be transmitted, including a digital processing device, a digital to RF converter and a dc-dc converter, wherein the output of the dc-dc converter can take a discrete voltage value from N discrete voltage values, N being an integer equal to or greater than 2, the digital processing device including a processing path including an envelope tracking control logic adapted to create a continuous envelope tracking control signal. The processing path further includes logic for driving the dc-dc converter including a peak value calculating device and a power supply voltage selecting device.

12 Claims, 3 Drawing Sheets

(51) Int. Cl.
| | |
|---|---|
| *H03F 3/189* | (2006.01) |
| *H03F 3/24* | (2006.01) |
| *H04B 1/04* | (2006.01) |
| *H02M 3/156* | (2006.01) |
| *H03F 3/19* | (2006.01) |
| *H04W 52/36* | (2009.01) |

(52) U.S. Cl.
CPC .............. *H03F 3/189* (2013.01); *H03F 3/19* (2013.01); *H03F 3/24* (2013.01); *H03F 3/245* (2013.01); *H04B 1/0475* (2013.01); *H04W 52/367* (2013.01); *H03F 2200/102* (2013.01); *H03F 2200/336* (2013.01); *H03F 2200/451* (2013.01); *H03F 2200/465* (2013.01); *H04B 2001/0408* (2013.01); *H04B 2001/0425* (2013.01)

(58) Field of Classification Search
USPC .................................................. 330/127, 136
See application file for complete search history.

(56) References Cited

U.S. PATENT DOCUMENTS

| | | | |
|---|---|---|---|
| 2009/0004981 | A1 | 1/2009 | Eliezer et al. |
| 2009/0261908 | A1 | 10/2009 | Markowski |
| 2010/0117727 | A1 | 5/2010 | Dawson et al. |
| 2010/0295613 | A1 | 11/2010 | Asbeck et al. |
| 2012/0062323 | A1 | 3/2012 | Le Gallou et al. |
| 2012/0176195 | A1 | 7/2012 | Dawson et al. |
| 2012/0309333 | A1 | 12/2012 | Nambu et al. |
| 2013/0072139 | A1 | 3/2013 | Kang et al. |
| 2013/0229235 | A1 | 9/2013 | Ohnishi |
| 2014/0097893 | A1* | 4/2014 | Ajima .................... H03F 3/245 330/136 |
| 2014/0118065 | A1 | 5/2014 | Briffa et al. |
| 2014/0118072 | A1 | 5/2014 | Briffa et al. |
| 2014/0132354 | A1 | 5/2014 | Briffa et al. |
| 2014/0133526 | A1 | 5/2014 | Camuffo et al. |
| 2014/0241462 | A1 | 8/2014 | Bellaouar et al. |

FOREIGN PATENT DOCUMENTS

| | | |
|---|---|---|
| WO | 2004/010283 A1 | 1/2004 |
| WO | 2014/037926 A2 | 3/2014 |
| WO | 2014/070475 A1 | 5/2014 |
| WO | 2014/085097 A1 | 6/2014 |

OTHER PUBLICATIONS

Garcia et al., "An overview of fast dc-dc converters for envelope amplifier in RF transmitters", Applied Power Electronics Conference and Exposition (APEC), 2012 Twenty-Seventh Annual IEEE, Feb. 5-9, 2012, pp. 1313-1318.

Wang et al., "Envelope Tracking Line-up Design Considerations with High Efficiency Linearizable Inverse Class-F Driver Amplifier", Journal of Wireless Networking and Communications, Jul. 24, 2012, pp. 83-94, vol. 2, No. 5.

Kanbe et al., "New Architecture for Envelope-Tracking Power Amplifier for Base Station", IEEE Asia Pacific Conference on Circuits and Systems (APCCAS), Nov. 30, 2008-Dec. 3, 2008, pp. 296-299.

Hiura et al., "High-Efficiency 400 W Power Amplifier with Dynamic Drain Voltage Control for 6 MHz OFDM Signal", Microwave Symposium Digest (MTT), 2010 IEEE MTT-S International, May 23-28, 2010, pp. 936-939.

Brackle et al., "Envelope tracking of a radio frequency amplifier for Long Term Evolution using a three-level class-G modulator", Advances in Radio Science, 2013,pp. 207-212, vol. 11.

Jeong et al., "Wideband Envelope Tracking Power Amplifier with Reduced Bandwidth Power Supply Waveform", Microwave Symposium Digest, IEEE MTT-S International, Jun. 7-12, 2009, pp. 1381-1384.

Montoro et al, "A Method for Real-Time Generation of Slew-rate Limited Envelopes in Envelope Tracking Transmitters", 2010 IEEE International Microwave Workshop Series on RF Front-ends for Software Defined and Cognitive Radio Solutions (IMWS), Feb. 22-23, 2010, pp. 1-4.

Montoro et al., "Digital Predistortion of Envelope Tracking Amplifiers Driven by Slew-Rate Limited Envelopes", Microwave Symposium Digest (MTT), 2011 IEEE MTT-S International, Jun. 5-10, 2011, pp. 1-4.

Gilabert et al., "Computationally efficient real-time digital predistortion architectures for envelope tracking power amplifiers", International Journal of Microwave and Wireless Technologies, Mar. 2013, pp. 187-193, vol. 5, No. 2.

International Search Report, dated Oct. 11, 2016, from corresponding PCT application No. PCT/FR2016/050043.

FR Search Report, dated Sep. 24, 2015, from corresponding FR application No. 1550331.

* cited by examiner

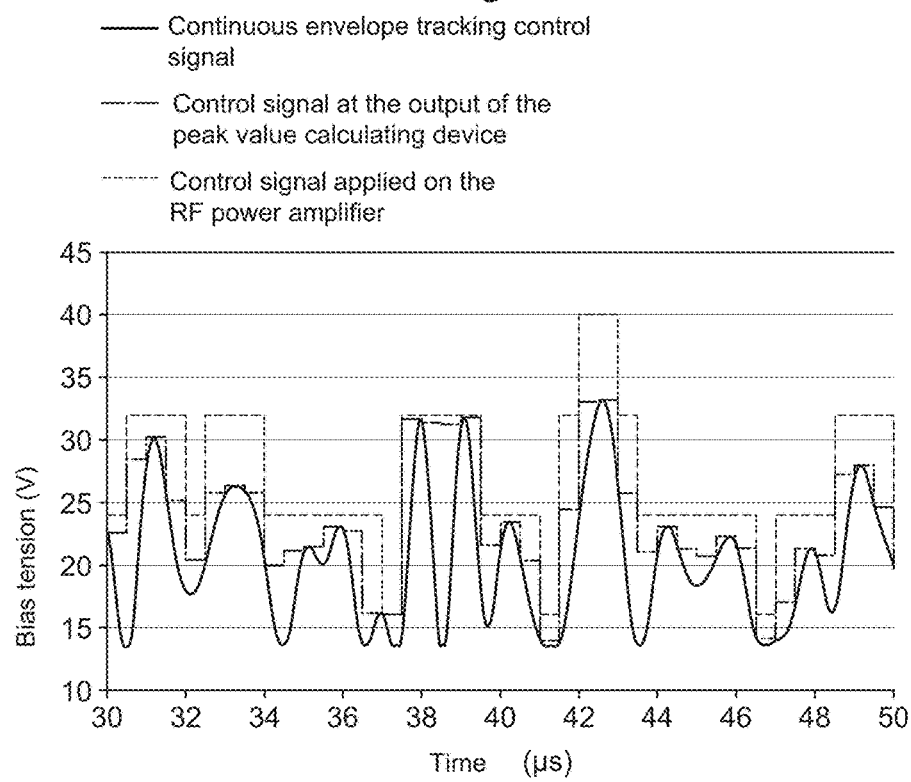
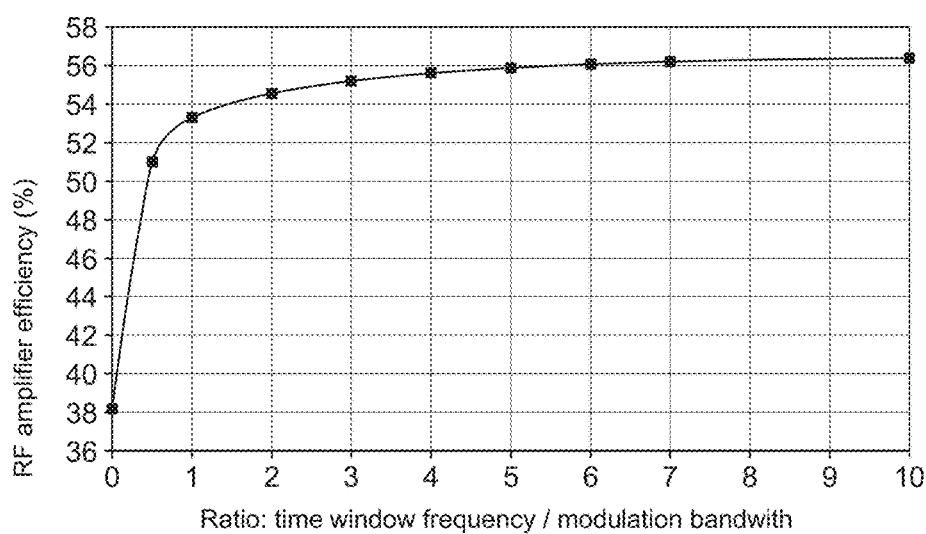

SYSTEM FOR MONITORING THE PEAK POWER FOR AN RF POWER AMPLIFICATION AND ASSOCIATED METHOD OF CALCULATING PEAK VALUE AND OF SELECTING SUPPLY VOLTAGE

BACKGROUND OF THE INVENTION

Field of the Invention

The present invention relates to the field of radiofrequency (RF) power amplification, and particularly relates to a system for monitoring the peak power for RF power amplification and to an associated method of calculating the peak value and of selecting the supply voltage.

Description of the Related Art

The constant increase in wireless communication data rates requires the use of complex modulations with high spectral efficiency such as OFDM (orthogonal frequency division multiplexing), these modulations having significant crest factors (ratio between the peak power and the average power of the signal).

The RF power amplifiers which are supplied with a direct supply voltage provide a maximum efficiency only when they operate at compression, namely at the peak power of the signal to be transmitted. However, most of the time, the amplifier delivers a power significantly smaller than its maximum power, close to the average power of the signal to be transmitted, the efficiency of the amplifier being in this case well below its maximum efficiency.

The envelope tracking technique is a power supply technique for improving the efficiency of the RF power amplifiers, replacing the direct constant supply of the amplifier by a direct dynamic supply which tracks the amplitude of the RF signal to be transmitted. The envelope tracking technique allows to dynamically adjust the supply voltage of the RF power amplifier such that the latter always operates at compression and, therefore, at its maximum efficiency, regardless of the power level of the envelope of the RF signal, this technique allowing, for the modern modulation formats, to improve significantly the efficiency of the RF power amplifiers while satisfying the requirements of the standards in terms of linearity.

In the case of an envelope tracking RF power amplifier, the power supply voltage is by definition continuously readjusted so as to ensure that the amplifier always operates at compression and thus at its maximum efficiency, regardless of the desired power level during the transmission.

The supply voltage of an envelope tracking RF power amplifier is generated by a dc-dc converter (also called polarization modulator) allowing to generate a continuous broadband control signal. The dc-dc converter generally comprises a switching dc-dc converter part operating at low frequencies and a linear amplification part allowing to track the quick variations of the envelope signal. However, the linear amplification part, which has a low efficiency, significantly deteriorates the overall efficiency of the dc-dc converter. Furthermore, the higher the bandwidth covered by the linear amplification portion, the more the overall efficiency is impacted by the low efficiency of the linear amplification part.

Another technique known and commonly used to generate a continuous envelope tracking control signal relies on the sole use of a switching dc-dc converter, the latter having to be fast enough to satisfy the requirements in terms of bandwidth as it relies on a sigma-delta or PWM (pulse width modulation) type switching signal. In addition, the control signal of the dc-dc converter should have a resolution sufficient to generate an important number of voltage levels at the output of the converter and, therefore, correctly reconstruct the initial signal. However, the switching transistors used for this type of converter are mainly transistors of GaN and GaAs technology which are capable of switching very quickly in the presence of a high power signal, and are generally made with an integrated technology so as to achieve better efficiencies and switching speeds, thereby significantly increasing the manufacturing cost of this type of converter.

The very fast switching of high currents in the dc-dc converters thus leads to the use of expensive component technologies, not compatible with the market of power amplification for telecommunications.

Another envelope tracking technique relies on the generation, by a dc-dc converter, of a multi-level type envelope tracking signal which consists in applying a polarization/power supply control signal with N discrete levels, wherein the power supply control signal of the RF amplifier can take one of the N possible discrete levels, which has the advantage of supporting large bandwidths while maintaining a high efficiency without using a linear amplifier within the dc-dc converter.

The problem of implementing the envelope tracking technique for high power applications lies in the capacity to provide for dc-dc converters with high efficiency and a large bandwidth. Thus, the difficulty lies in this dc-dc converter which should provide high powers, have a very good efficiency, be extremely linear, generate little noise, and especially support large modulations bands.

The efficiency of the dc-dc converters significantly decreasing when the bandwidth of the modulated signal increases, it seems complex to use the envelope tracking technique for high power applications with modern telecommunications signals which can reach bandwidths up to 100 MHz.

Together with the envelope tracking technique, in order to decrease the constraints on the dc-dc converter, a band reduction technique can be used. The band reduction decreases the spectral occupancy of the power supply signal while ensuring that the voltage of the band-reduced power supply signal is still equal to or greater than the voltage of the original signal so as not to over-compress the RF amplifier.

This band reduction of the power supply signal necessarily induces a decrease in efficiency of the power amplifier as the control signal no longer tracks the envelope of the modulated signal at each instant.

Furthermore, the addition of a band reduction algorithm requires a system with increased complexity for generating this type of control, namely for the digital processing of the signal. Furthermore, a band reduction technique should necessarily be coupled to a pre-distortion technique specific to this operating mode, and would thus be also complex to implement.

The dc-dc converters for the envelope tracking technique should have bandwidths significantly higher than the bandwidth of the RF signal. With regard to the increase in bandwidths of the modern telecommunication signals, it seems relatively complex to have dc-dc converters with a good efficiency and low cost for high power applications, despite the use of new component technologies such as gallium nitride (GaN).

The existing band reduction techniques are complex to implement and do not allow to consider very large modulation bands with a good overall efficiency of the system.

In addition, in the case of the envelope tracking technique with multiple discrete levels, the principle of band reduction cannot be applied. Indeed, no decrease in constraints in terms of speed and switching recurrences on the dc-dc converter appear.

The trade-off between efficiency and bandwidth of the dc-dc converter turns out to significantly limit the high power applications for using the envelope tracking technique. This results in the impossibility to use the envelope tracking technique for high power and large bandwidth applications.

A first solution consists in using multi-phase Buck (voltage down-converter) or Boost (voltage up-converter) type dc-dc converters for generating a continuous type control signal, namely containing several branches in parallel. These converters operate in pure switching and, according to their very own operation principle, allow to decrease the switching frequency for the same bandwidth and with a good efficiency. However, in order to allow high bandwidths, the switching frequencies remain very high and therefore this technique does not solve the efficiency/bandwidth problem. In addition, the frequency of the switching signal remains stationary for this type of converter and therefore for low bandwidths, the efficiency of the converter will be unnecessarily sacrificed.

A second solution relies on band reduction techniques for envelope tracking which allow to improve the efficiency/bandwidth trade-off without solving nevertheless the problem for large modulation bands and provide the system with an increased complexity in terms of digital processing of the signal, thereby increasing the cost and power consumption of the system.

A last solution consists in using a control signal which does not come from a continuously variable modulator, but from the selection of different power supply levels for generating a discrete type control signal. The multi-level envelope tracking technique does not allow to obtain RF amplifier efficiencies as high as with a continuous control signal, but the losses of the converter are lower. However, this solution improves, but does not allow to solve, the efficiency/bandwidth trade-off for large modulation bandwidths due to the fact that the switching recurrences remain important in number.

American patent application US2014241462 A1 discloses an envelope tracking system and method according to the prior art.

American patent application US2014118065 A1 discloses a system for monitoring the peak power according to the prior art.

BRIEF SUMMARY OF THE INVENTION

The present invention is intended to solve the disadvantages of the prior art by providing a system for monitoring the peak power of a telecommunication signal to be transmitted for RF power amplification of said telecommunication signal to be transmitted, comprising a logic for driving the dc-dc converter allowing to push back the efficiency/bandwidth limitation imposed by the dc-dc converters so as to make the envelope tracking technique applicable to high power applications with high rates, said system allowing to generate a high power control signal adapted for applications with a very large modulation band without necessarily requiring ultra-fast converters, and thus switching transistors, capable to switch high currents in a very short time, said system further allowing to maintain a very good efficiency on the dc-dc converters, even for large modulation bands.

The driving logic consists, among other things, in analyzing and detecting the maximum value of the continuous envelope tracking control signal on a determined time interval, and then in applying, instead of a conventional envelope tracking control signal, a constant supply voltage level on the RF power amplifier from a number of available voltage levels, said voltage level being applied for a minimum duration equal to the determined time interval. The invention thus allows to generate a discrete type power supply signal which slowly changes in relation to the modulation band of the signal, these features allowing to use a dc-dc converter with a very low cost and high efficiency, even for large modulation bands.

The invention also relates to a method for calculating the peak value and selecting the power supply voltage, implemented by a system for monitoring the peak power of a telecommunication signal to be transmitted for RF power amplification of said telecommunication signal to be transmitted according to the present invention, and to a RF antenna equipped with such a system or implementing such a method.

The present invention thus relates to a system for monitoring the peak power of a telecommunication signal to be transmitted for RF power amplification of said telecommunication signal to be transmitted, comprising a RF power amplifier having a RF input, a power supply voltage input and a RF output, a digital processing device, a digital to RF converter and a dc-dc converter, the digital processing device having an input adapted to receive the telecommunication signal to be transmitted as digital data, a first output connected to an input of the digital to RF converter and a second output connected to an input of the dc-dc converter, the digital to RF converter having an output connected to the RF input of the RF power amplifier, the dc-dc converter having an output connected to the power supply voltage input of the RF power amplifier, wherein the output of the dc-dc converter can take a discrete voltage value among N discrete voltage values, N being an integer equal to or greater than 2, the digital processing device comprising, between its input and its first output, a delay element $\tau$ and, between its input and its second output, a processing path comprising an envelope tracking control logic adapted to create a continuous envelope tracking control signal from the digital data received at the input of the digital processing device, characterized in that the processing path further comprises, downstream from the envelope tracking control logic, a logic for driving the dc-dc converter comprising a peak value calculating device and a power supply voltage selecting device, the peak value calculating device being adapted to time window the continuous envelope tracking control signal and to calculate the maximum value of the continuous envelope tracking control signal for each time window, and the power supply voltage selecting device being adapted to control the dc-dc converter so as to impose on the output of the latter, from the N discrete voltage values, a discrete power supply voltage value equal to or greater than the maximum value of the continuous envelope tracking control signal on the entire corresponding time window, said discrete power supply voltage value being applied for a minimum duration equal to the duration of the time window, the delay element $\tau$ being selected such that the RF signal corresponding to digital data of the telecommunication signal to be transmitted at the RF input of the RF power amplifier is synchronized with the envelope tracking-type power supply voltage of the RF signal for those same digital data at the power supply voltage input of the RF power amplifier.

It can be noted that, in the system according to the invention, the N voltage levels are not necessarily evenly distributed. The voltage selecting device is thus adapted to select one of the N voltage levels which is equal to or greater than the maximum value of the continuous envelope tracking control signal on one window, wherein the N voltage levels can be evenly distributed or not.

The control logic of the processing path is configured to implement an envelope tracking control law.

The invention consists in generating a discrete type envelope tracking control signal having N slowly-variable voltage levels by means of a technique for monitoring the peak voltage of the continuous envelope tracking control signal, the detection of the peak voltage of the continuous control signal being directly the image of the detection of the peak power at the input of the RF power amplifier.

The control signal of the RF amplifier can have only one voltage value at a time among the N possible levels and those voltage levels do not adapt to the quick variations of the envelope signal, the selected voltage level being applied for a minimum duration equal to the time window. The selections of the number of levels N and the duration of the time window mainly depend on the capacities of the dc-dc converter, of the rate of symbols to be transmitted, and of the modulation format (for example, QAM (quadrature amplitude modulation) or OFDM).

Thus, the generation of a discrete-level signal which does not precisely track all the variations of the modulation envelope allows to support very large bandwidths, while maintaining a high efficiency of the dc-dc converter, and to minimize the switching frequency within said converter, regardless of the converter architecture or of the modulation type. The discretization into a finite number of power supply levels allows to avoid the use of a linear amplifier within the dc-dc converter, and the fact that the amplitude of the envelope signal is not precisely tracked at each instant allows to consider very high bandwidths without increasing the constraints on the dc-dc converter in terms of switching speed.

In addition, the driving logic is simple to implement in a digital circuit, thereby minimizing the number of logical circuits required in the digital circuits as well as the operating frequency thereof, which results in a lower power consumption and a reduced circuit supply cost. The invention also allows to use a dc-dc converter which has a lower speed and thus at a low manufacturing cost.

Furthermore, this driving logic allows to prevent threshold effects which could result in very short pulses, and thus a dysfunction of the system every now and then.

The delay T allows to synchronize the good power supply voltage of the RF amplifier according to the input data.

Finally, the fact that the discrete power supply voltage value is equal to or greater than the maximum value of the continuous envelope tracking control signal on the entire corresponding time window allows to ensure the proper operation of the RF power amplifier, by preventing an over-compression of the RF power amplifier.

According to a particular feature of the invention, the processing path is a digital processing path, and N is smaller, preferably strictly smaller, than 2^(processing_path_bit_number), where processing_path_bit_number is the number of bits of the digital processing path.

According to a particular feature of the invention, the continuous envelope tracking control signal is sampled at a predetermined sampling frequency, the time window being defined by a predefined number of samples of the sampled continuous envelope tracking control signal, the frequency of the time window being a sub-multiple frequency of the sampling frequency.

Thus, the periodicity of the time window, which is defined by a predefined number of samples, allows to limit the duration between two switchings in the dc-dc converter, the values of the different samples in a time window being compared so as to determine the maximum value of the samples in the time window.

According to a particular feature of the invention, the number of voltage levels N is between 2 and 16.

The selection of N mainly depends on the capacities of the dc-dc converter, on the rate of symbols to be transmitted, and on the modulation format.

It can be noted that the higher N is, the more complex and expensive to produce the system is.

According to a particular feature of the invention, the phase shift between the clock of the time window and the sampling clock of the continuous envelope tracking control signal is adjustable and is an integer number of samples of the continuous envelope tracking control signal.

Thus, the position of the time window is adjustable with respect to the sampling frequency of the signal to be transmitted so as to optimize the control signal generated to avoid the risk of change of the control voltage upon decision. This results practically in a phase shift between the sampling clock of the signal to be transmitted and the clock of the time window, said phase shift being defined by an integer number of samples.

According to a particular feature of the invention, the digital processing device is implemented in a programmable digital circuit, preferably a processor, a microprocessor, a microcontroller, a digital signal processor (DSP), an application-specific integrated circuit (ASIC) or a field programmable gate array (FPGA).

Thus, the digital processing device can easily be implemented in a common programmable digital circuit.

According to a particular feature of the invention, the type of the dc-dc converter is multiple-power supply input type, Buck (voltage down-converter) or Boost (voltage up-converter) type, or multi-phase type.

Thus, the dc-dc converter can generate a slow-varying discrete type control signal, the switching speed of which is not the major element, this converter having an excellent conversion efficiency.

In the case of a multiple-power-supply-input type dc-dc converter, different power supply voltages are connected to the multiple power supply inputs of the dc-dc converter, and one of the power supply voltages is selected, by power transistor switches, at the output of the dc-dc converter, the dc-dc converter having as many power supply inputs as output levels to apply.

In the case of a Buck type dc-dc converter, one or two power supply voltages are provided to the dc-dc converter. For a Buck converter having two power supply voltages, a low voltage and a high voltage bound the control voltage range which the converter will be able to provide for the envelope tracking, thereby minimizing the losses by switching, and significantly improving the efficiency.

In the case of a Boost type dc-dc converter, a single power supply voltage is provided to the dc-dc converter. This voltage is necessarily lower than the low envelope tracking voltage.

In the case of a multi-phase type dc-dc converter, which could be of Buck or Boost type, one or two power supply voltages are provided to the dc-dc converter and the architecture of said converter allows to distribute the current to be provided on multiple phases in parallel, and thus to minimize the switching frequency of the switching transistors.

According to a particular feature of the invention, the digital to RF converter comprises a digital to analog converter associated with a RF mixer of IQ modulator type, for example.

Thus, the digital to RF converter can first convert the digital data from the digital processing device into analog data, via the digital to analog converter, and then mix the analog data with a RF signal, via the RF mixer.

According to a particular feature of the invention, the system further comprises a low-pass filter arranged between the output of the dc-dc converter and the power supply voltage input of the RF power amplifier.

The low-pass filter thus allows to perfectly control the transition characteristics of the discrete type control signal from one discrete voltage level to another, and if required, to fully reject the switching residual ripple.

According to a particular feature of the invention, the digital processing device further comprises a pre-distortion logic which linearizes the gain of the RF power amplifier.

Thus, the distortions of the RF amplifier subjected to a discrete-level envelope tracking signal can be linearized by the pre-distortion logic.

The present invention also relates to a method for calculating the peak value and selecting the power supply voltage, implemented by a system for monitoring the peak power of a telecommunication signal to be transmitted for RF power amplification of said telecommunication signal to be transmitted such as described above, characterized in that it comprises the following steps:

time windowing a continuous envelope tracking control signal;
calculating a maximum value of the continuous envelope tracking control signal for each time window;
selecting, for each time window and among the N discrete voltage values, a discrete power supply voltage value equal to or greater than the maximum value of the continuous envelope tracking control signal on the entire corresponding time window; and
controlling a dc-dc converter so as to impose on the output of the latter the selected discrete power supply voltage value on each time window.

Thus, said method allows to limit the constraints in terms of switching speed on the dc-dc converter of the envelope tracking RF power amplification system.

It can be noted that, in the case where the time window is defined by a predefined number of samples of the sampled continuous envelope tracking control signal, the calculated maximum value then corresponds to the value of the sample having the maximum value among all the samples of the time window.

The present invention also relates to a RF transmission antenna provided with a system for monitoring the peak power of a telecommunication signal to be transmitted for RF power amplification of said telecommunication signal to be transmitted according to the present invention, or implementing a method for calculating the peak value and selecting the power supply voltage according to the invention.

BRIEF DESCRIPTION OF THE DRAWINGS

For a better understanding of the object of the present invention, a preferred embodiment will be described below, for illustrative and non-limiting purposes, in reference to the appended drawings.

In these drawings:

FIG. 5 illustrates exemplary curves of different envelope tracking control signals in the system for monitoring the peak power for RF power amplification according to the present invention; and FIG. 6 illustrates an exemplary curve of the efficiency of a RF power amplifier of the system for monitoring the peak power for RF power amplification according to the present invention, as a function of the ratio of the frequency of the time window to the bandwidth of the modulation.

DETAILED DESCRIPTION OF THE PREFERRED EMBODIMENTS

Figure 1:
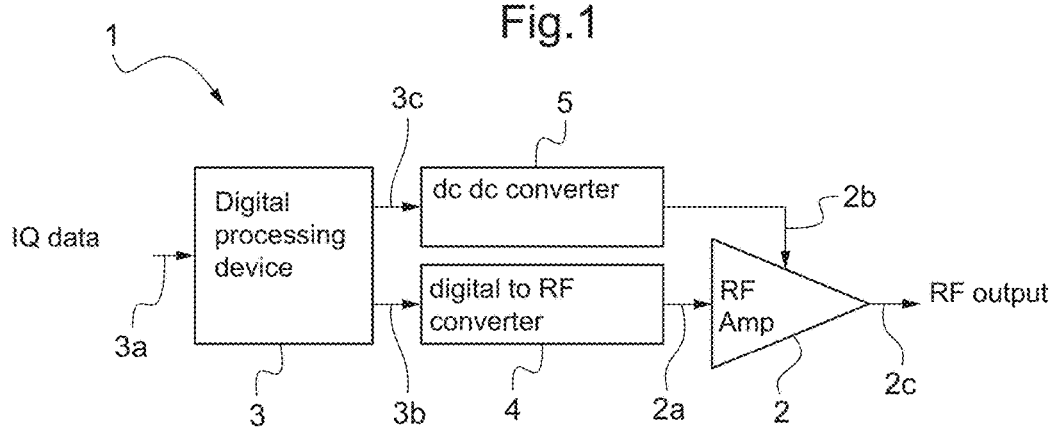
FIG. 1 is a schematic diagram of a system for monitoring the peak power for RF power amplification according to the present invention.

Referring to FIG. 1, a system for monitoring the peak power for RF power amplification 1 according to the present invention is shown.

The system for monitoring the peak power for RF power amplification 1 comprises a RF power amplifier 2 having a RF input 2a, a power supply voltage input 2b and a RF output 2c, a digital processing device 3, a digital to RF converter 4 and a dc-dc converter 5.

The digital processing device 3 has an input 3a adapted to receive digital I/Q data representing a telecommunication signal to be transmitted via RF by the RF amplifier 2, a first output 3b connected to an input of the digital to RF converter 4, and a second output 3c connected to an input of the dc-dc converter 5.

The digital to RF converter 4 has an output connected to the RF input 2a of the RF power amplifier 2.

The dc-dc converter 5 has an output connected to the power supply voltage input 2b of the RF power amplifier 2, wherein the output of the dc-dc converter 5 can take a discrete voltage value from N discrete voltage values, N being an integer number equal to or greater than 2, preferably between 2 and 16.

The RF power amplifier 2 has semiconductor power elements such as semiconductor power transistors (not shown in FIG. 1).

The digital to RF converter 4 has a digital to analog converter associated with a RF mixer (not shown in FIG. 1), the digital to analog converter converting the digital data from the digital processing device 3 into analog data, and the RF mixer mixing said analog data with a RF signal.

The digital processing device 3 and the dc-dc converter 5 will be described in more detail below.

This system 1 thus allows to apply a discrete-level envelope tracking technique so as to improve the efficiency of the RF power amplifier 2, the power supply of the amplifier 2 being dynamic and tracking the amplitude of the RF signal to be transmitted, the RF power amplifier 2 still operating at compression and thus at its maximum efficiency, regardless of the power level of the envelope of the RF signal.

The control signal of the RF power amplifier 2, at its power supply voltage input 2b, can dynamically take one of the N possible discrete voltage values so as to track the envelope of the RF signal to be transmitted.

Figure 2:
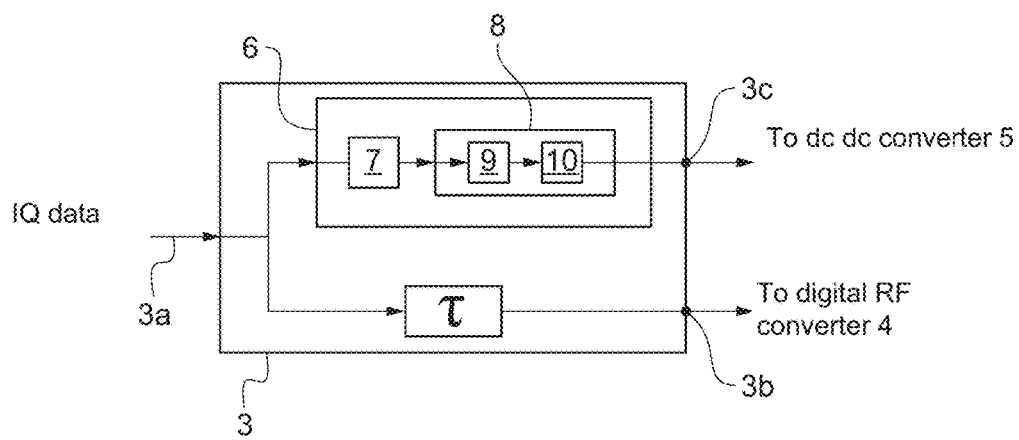
FIG. 2 is a schematic diagram of a digital processing device of the system for monitoring the peak power for RF power amplification according to the present invention.

If referring to FIG. 2, the digital processing device 3 of the system for monitoring the peak power for RF power amplification 1 according to the present invention is shown.

The digital processing device 3 has, between its input 3a and its first output 3b, a delay element τ and, between its input 3a and its second output 3c, a processing path 6.

The processing path 6 has an envelope tracking control logic 7 adapted to create a continuous envelope tracking control signal from the digital data received at the input 3a of the digital processing device 3.

The control logic 7 is configured to implement an envelope tracking control law.

The control law is, for example, a non-linear function expressed as a polynomial having an degree of 3 to 7. The control law is described below, in the case where the degree is 3:

$$Vcontrol = A + B*Venv + C*Venv^2 + D*Venv^3$$

where A, B, C and D are the constants of the control law and Venv is the envelope voltage of the signal to be transmitted, directly linked to the input power to the RF amplifier.

The processing path 6 further comprise a driving logic 8 of the dc-dc converter 5, comprising a peak value calculating device 9 and a supply voltage selecting device 10.

The peak value calculating device 9 is adapted to time window the continuous envelope tracking control signal coming from the envelope tracking control logic 7, and to calculate the maximum value of the continuous envelope tracking control signal for each time window.

The power supply voltage selecting device 10 is adapted to control the dc-dc converter 5 so as to impose on the output of the latter an optimum discrete voltage value among the N discrete voltage values according to said maximum value on the time window calculated by the peak value calculating device 9, said optimum discrete voltage value being applied for a minimum duration equal to the duration of the time window, said applied optimum discrete voltage value being equal to or greater than the continuous envelope tracking control signal on the entire corresponding time window so as not to over-compress the RF power amplifier 2.

The delay element τ is selected such that the RF signal corresponding to digital data of the telecommunication signal to be transmitted at the RF input 2a of the RF power amplifier 2 is synchronized with the envelope tracking type power supply voltage of the RF signal for those same digital data at the power supply voltage input 2b of the RF power amplifier 2.

It can be noted that the digital processing device 3 could further have a pre-distortion logic which linearizes the gain of the RF power amplifier 2, without departing from the scope of the present invention.

It can be noted that the entire digital processing device 3 is implemented into a programmable digital circuit, preferably a processor, a microprocessor, a microcontroller, a DSP, an ASIC or a FPGA.

The continuous envelope tracking control signal is sampled at a predetermined sampling frequency, the time window used by the peak value calculating device 9 being defined by a predefined number of samples of the sampled continuous envelope tracking control signal, the frequency of the time window thus being a sub-multiple frequency of the sampling frequency.

It can be noted that an adjustable phase shift can be performed between the clock of the time window and the sampling clock of the continuous envelope tracking control signal, said phase shift being an integer number of samples of the sampled continuous envelope tracking control signal. Thus, the adjustable position of the time window with respect to the sampling frequency of the signal to be transmitted allows to optimize the generated control signal to avoid the risk of change in the control voltage upon decision.

Figure 3:
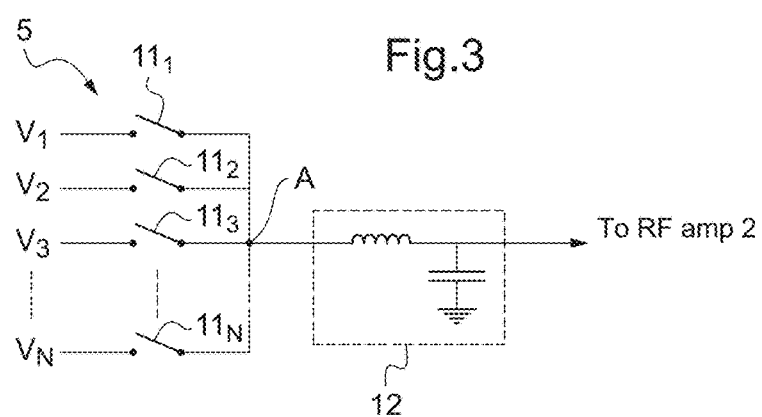
FIG. 3 is a schematic diagram of a dc-dc converter of the system for monitoring the peak power for RF power amplification according to the present invention.

If referring to FIG. 3, the dc-dc converter 5 of the system for monitoring the peak power for RF power amplification 1 according to the present invention is shown.

The dc-dc converter 5, in this preferred embodiment, is of multiple-power supply input type.

It can be noted that the dc-dc converter 5 could also be of Buck (voltage down-converter) or Boost (voltage up-converter) type, or multi-phase type, without departing from the scope of the present invention.

The multiple-power supply input type dc-dc converter 5 has N different power supply voltages $V_1$-$V_n$, N corresponding to the desired number of possible discrete voltage values at the output of the dc-dc converter 5, and N power transistor switches $11_1$-$11_N$, each comprising first and second terminals, the first terminals of the N switches $11_1$-$11_N$ being respectively connected to the N power supply voltages, and the second terminals of the N switches $11_1$-$11_N$ being connected to a common node A.

The N switches $11_1$-$11_N$ are dynamically controlled by the digital processing device 3, such that a single switch from the N switches $11_1$-$11_N$ is closed at a time so as to apply the associated power supply voltage on the node A.

Thus, the dc-dc converter 5 can generate a slow-varying discrete type control signal, the switching speed of which is not the major element, this dc-dc converter 5 having an excellent conversion efficiency.

The dc-dc converter 5 further comprise a low-pass filter 12 arranged between the node A and the power supply voltage input 2b of the RF power amplifier 2, the low-pass filter 12 allowing to perfectly control the transition characteristics of the discrete type control signal from one discrete voltage value to another, and if required, to fully reject the switching residual ripple.

Although, for simplicity purposes, a simple LC (inductance-capacitor) resonant circuit has been illustrated for showing the low-pass filter 12, the low-pass filter 12 could be a more complex low-pass filter with an order equal to or greater than 2, without departing from the scope of the present invention.

It can be noted that it would be possible for the dc-dc converter 5 not to have a low-pass filter 12 at its output, without departing from the scope of the present invention.

Figure 4:
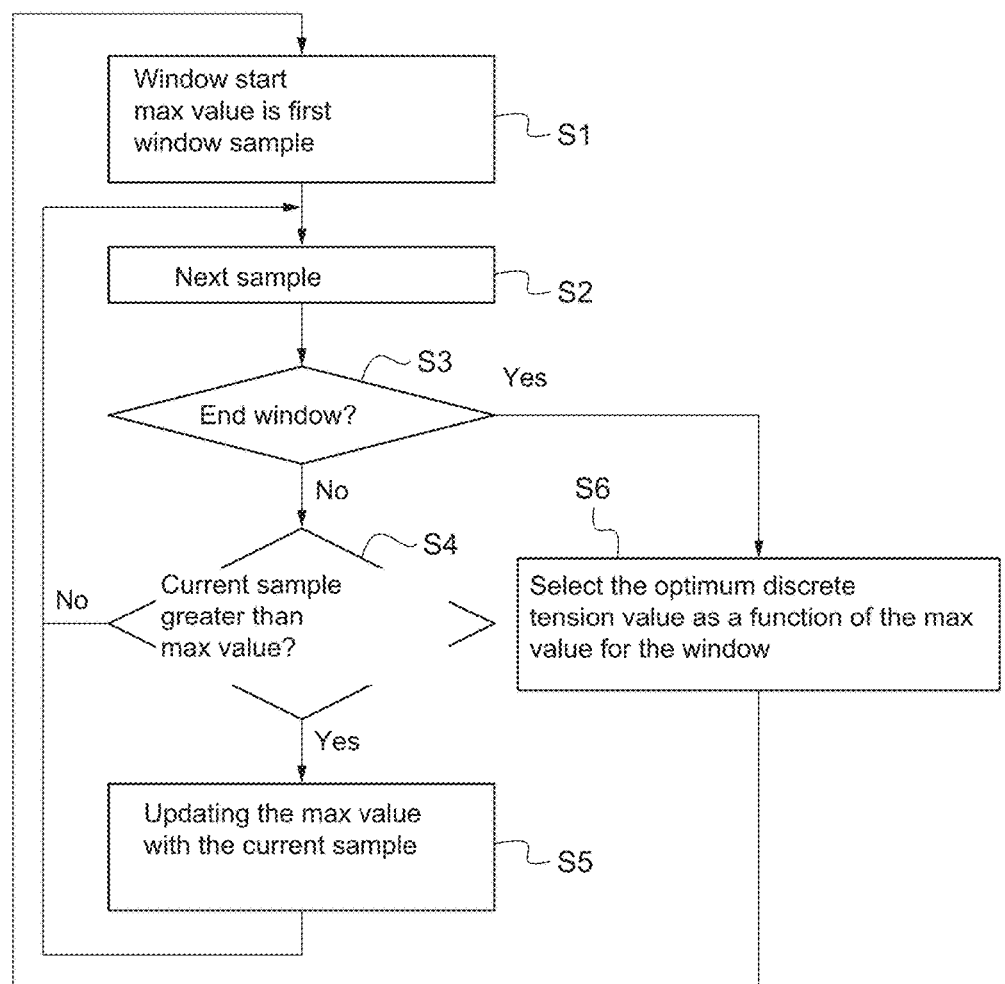
FIG. 4 is a flow diagram of a method for calculating the peak value and selecting the power supply voltage, implemented by the system for monitoring the peak power for RF power amplification according to the present invention

If referring to FIG. 4, a method for calculating the peak value and selecting the power supply voltage, implemented by the system for monitoring the peak power for RF power amplification 1 according to the present invention, is shown.

The method for calculating the peak value and selecting the power supply voltage comprises the following steps:
  time windowing the continuous envelope tracking control signal from the envelope tracking control logic 7, the time window being defined by a predefined number of samples of the sampled continuous envelope tracking control signal;
  calculating a maximum value of the continuous envelope tracking control signal for each time window, said calculation comprising, for each time window, the following steps:

receiving S1 the first sample of the time window, the maximum value being set at the value of the first sample;

receiving S2 the subsequent sample;

determining S3 whether the time window is complete and, if so, jumping to step S6 and, if not, jumping to step S4;

determining S4 whether the value of the current sample is greater than the maximum value and, if this is not the case, returning to step S2 and, if this is the case, updating S5 the maximum value with the value of the current sample and then returning to step S2;

selecting S6, for each time window, an optimum discrete voltage value among the N discrete voltage values as a function of said maximum value calculated on the time window, said optimum discrete voltage value being equal to or greater than the maximum value of the envelope tracking control signal on the entire corresponding time window; and controlling the dc-dc converter 5 so as to impose on the output of the latter the selected optimum discrete voltage value on each time window.

If referring to FIG. 5, exemplary curves of different envelope tracking control signals in the system for monitoring the peak power for RF power amplification 1 according to the present invention are shown.

The continuous line curve represents an exemplary continuous envelope tracking control signal from the envelope tracking control logic 7, said curve being shown as power supply voltage over time so as to facilitate the reader's understanding.

The chain-dotted line curve represents the control signal at the output of the peak value calculating device 9, said curve being shown as power supply voltage over time so as to facilitate the reader's understanding.

The dotted line curve represents the control signal at the output of the dc-dc converter 5 applied to the RF power amplifier 2, said curve being shown as supply voltage over time.

In this example, the method for calculating the peak value and selecting the supply voltage is applied to the signal coming from the envelope tracking control logic 7 for a modulated signal with a bandwidth of 1 MHz. The time window used has a frequency equivalent to 2 MHz, namely 500 ns. In addition, the dc-dc converter 5 used has four possible discrete voltage values on the output, namely V1=16 V, V2=24 V, V3=32 V and V4=40 V.

The control signal at the output of the peak value calculating device 9 corresponds to the peak power of the continuous envelope tracking control signal after windowing every 500 ns.

The control signal applied to the RF power amplifier 2, indicated below by $V_{out}$, is created from the control signal at the output of the peak value calculating device 9, indicated below by X(n), according to the following algorithm:

if $X(n) \leq V1$, $V_{out}=V1$;
if $V1<X(n) \leq V2$, $V_{out}=V2$;
if $V2<X(n) \leq V3$, $V_{out}=V3$; and
if $V3<X(n)$, $V_{out}=V4$.

Thus, $V_{out}$ is constantly equal to or greater than the continuous envelope tracking control signal so as to ensure the proper functioning of the RF power amplifier 2, the application duration of a voltage level being at least equal to the time window of 500 ns. Furthermore, this example shows that the present invention allows to minimize the switching frequency within the dc-dc converter 5, thereby allowing to achieve a high efficiency of the dc-dc converter 5 for large modulation bands.

If referring to FIG. 6, an exemplary curve of the efficiency of a RF power amplifier 2 of the system for monitoring the peak power for RF power amplification 1 according to the present invention is shown as a function of the ratio of the frequency of the time window to the bandwidth of the modulation.

In this example, a 16QAM type modulation is applied to a RF power amplifier 2. The efficiency measured for a continuous supply voltage is compared to the efficiencies obtained for different time window widths for detecting the peak control voltage. The frequency of the time window varies from 0.5 times the bandwidth (or rate of symbols) of the modulated signal to 10 times the bandwidth of the modulated signal. Furthermore, in this example, four discrete power supply voltage levels are used for controlling the RF power amplifier 2.

The efficiency of the amplifier at the vertical-intercept corresponds to the efficiency obtained with a fixed supply voltage, namely about 38%.

The efficiency of the amplifier obtained with a continuous envelope tracking signal is nearly 60%.

FIG. 6 shows that a time window which is twice the bandwidth of the signal to be transmitted allows to obtain, with four power supply voltage levels, an amplifier efficiency close to the maximum efficiency, while ensuring an efficiency of the dc-dc converter 5 well above those of dc-dc converters using multi-level or continuous envelope tracking techniques. Furthermore, the dc-dc converter 5 does not need to be as fast in terms of switching speed, and is thus much more simpler to implement.

The invention also relates to a RF transmission antenna equipped with the system for monitoring the peak power for RF power amplification 1 according to the present invention, or implementing a method for calculating the peak value and selecting the power supply voltage according to the present invention.

The present invention can, for example, find an application in base stations for mobile telephony, radars, electronic war devices, mobile phones or any other wireless telecommunication equipment.

The invention claimed is:

1. A system for monitoring the peak power of a telecommunication signal to be transmitted for the RF power amplification of the telecommunication signal to be transmitted, comprising:

a RF power amplifier having a RF input, a power supply voltage input and a RF output,
a digital processing device,
a digital to RF converter, and
a dc-dc converter,
the digital processing device having an input adapted to receive the telecommunication signal to be transmitted as digital data, a first output connected to an input of the digital to RF converter and a second output connected to an input of the dc-dc converter, the digital to RF converter having an output connected to the RF input of the RF power amplifier, the dc-dc converter having an output connected to the power supply voltage input of the RF power amplifier, wherein the output of the dc-dc converter can take a discrete voltage value among N discrete voltage values, N being an integer equal to or greater than 2, the digital processing device comprising, between the input and the first output, a delay element τ and, between the input and the second output, a processing path comprising an envelope tracking control logic adapted to create a continuous envelope tracking control signal from the digital data received at the input of the digital processing device, wherein the processing path further comprises, downstream from the envelope tracking control logic, a logic for driving the dc-dc converter comprising a peak value calculating device and a power supply voltage selecting device, the peak value calculating device being adapted to time window the continuous envelope tracking control signal and to calculate the maximum value of the continuous envelope tracking control signal for each time window, and the power supply voltage selecting device being adapted to control the dc-dc converter so as to impose on the output of the dc-dc converter, from the N discrete voltage values, a discrete supply voltage value equal to or greater than the maximum value of the continuous envelope tracking control signal on the entire corresponding time window, the discrete power supply voltage value being applied for a minimum duration equal to the duration of the time window, the delay element τ being selected such that the RF signal corresponding to digital data of the telecommunication signal to be transmitted at the RF input of the RF power amplifier is synchronized with the envelope tracking-type power supply voltage of the RF signal for the same digital data at the power supply voltage input of the RF power amplifier.

2. The system according to claim 1, wherein the processing path is a digital processing path, and wherein N is smaller than $2^{(processing\_path\_bit\_number)}$, where processing_path_bit_number is the number of bits of the digital processing path.

3. The system according to claim 1, wherein the continuous envelope tracking control signal is sampled at a predetermined sampling frequency, the time window being defined by a predefined number of samples of the sampled continuous envelope tracking control signal, the frequency of the time window being a sub-multiple frequency of the sampling frequency.

4. The system according to claim 1, wherein the number of voltage levels N is between 2 and 16.

5. The system according to claim 3, wherein the phase shift between the clock of the time window and the sampling clock of the continuous envelope tracking control signal is adjustable and is an integer number of samples of the continuous envelope tracking control signal.

6. The system according to claim 1, wherein the digital processing device is implemented in a programmable digital circuit.

7. The system according to claim 1, wherein the dc-dc converter is one of a multiple-power-supply-input type dc-dc converter, a Buck (down-converter) dc-dc converter, a Boost (up-converter) type dc-dc converter, and a multiphase type dc-dc converter.

8. The system according to claim 1, wherein the digital to RF converter comprises a digital to analog converter associated with a RF mixer.

9. The system according to claim 1, wherein the system further comprises a low-pass filter arranged between the output of the dc-dc converter and the power supply voltage input of the RF power amplifier.

10. The system according to claim 1, wherein the digital processing device further comprises a pre-distortion logic which linearizes the gain of the RF power amplifier.

11. A method for calculating a peak value and selecting a power supply voltage, implemented by a system for monitoring the peak power of a telecommunication signal to be transmitted for RF power amplification of the telecommunication signal to be transmitted according to claim 1, wherein the method comprises the following steps:
    time windowing a continuous envelope tracking control signal;
    calculating a maximum value of the continuous envelope tracking control signal for each time window;
    selecting, on each time window and from the N discrete voltage values, a discrete power supply voltage value equal to or greater than the maximum value of the continuous envelope tracking control signal on the entire corresponding time window; and
    controlling a dc-dc converter so as to impose on the output of the latter the selected discrete power supply voltage value on each time window.

12. A RF transmission antenna equipped with a system for monitoring the peak power of a telecommunication signal to be transmitted for RF power amplification of the telecommunication signal to be transmitted according to claim 1.

* * * * *